United States Patent
Jan et al.

(10) Patent No.: US 8,470,669 B2
(45) Date of Patent: Jun. 25, 2013

(54) SYSTEM AND METHOD FOR EEPROM ARCHITECTURE

(75) Inventors: Yipeng Jan, Shanghai (CN); Zhen Yang, Shanghai (CN); Shenghe Huang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 351 days.

(21) Appl. No.: 12/959,229

(22) Filed: Dec. 2, 2010

(65) Prior Publication Data

US 2011/0133264 A1    Jun. 9, 2011

(30) Foreign Application Priority Data

Dec. 4, 2009    (CN) .......................... 2009 1 0199991

(51) Int. Cl.
*H01L 21/00*    (2006.01)

(52) U.S. Cl.
USPC ............................. 438/264; 438/257; 438/259

(58) Field of Classification Search
USPC .......................................... 438/264, 257, 259
See application file for complete search history.

(56) References Cited

U.S. PATENT DOCUMENTS

| | | | | |
|---|---|---|---|---|
| 5,482,881 A * | 1/1996 | Chen et al. | ..................... | 438/264 |
| 5,780,341 A * | 7/1998 | Ogura | .......................... | 438/259 |
| 6,074,916 A * | 6/2000 | Cappelletti | ................... | 438/258 |
| 6,157,058 A * | 12/2000 | Ogura | ........................... | 257/315 |
| 6,274,430 B1 * | 8/2001 | Jan et al. | ........................ | 438/258 |
| 6,355,524 B1 * | 3/2002 | Tuan et al. | ..................... | 438/257 |
| 6,518,618 B1 * | 2/2003 | Fazio et al. | .................... | 257/315 |
| 6,617,636 B2 * | 9/2003 | Tuan et al. | ..................... | 257/315 |
| 7,008,847 B2 * | 3/2006 | Park | ............................... | 438/264 |
| 7,166,509 B2 * | 1/2007 | Forbes | .......................... | 438/257 |
| 7,408,230 B2 * | 8/2008 | Park et al. | ...................... | 257/390 |
| 7,485,918 B2 * | 2/2009 | Yamamoto et al. | ........... | 257/315 |
| 8,247,861 B2 * | 8/2012 | Tempel et al. | ................. | 257/316 |
| 8,278,203 B2 * | 10/2012 | Liang et al. | .................... | 438/593 |
| 2002/0038897 A1 * | 4/2002 | Tuan et al. | ..................... | 257/372 |
| 2002/0042180 A1 * | 4/2002 | Tuan et al. | ..................... | 438/257 |
| 2003/0206447 A1 * | 11/2003 | Tuan et al. | ............... | 365/185.33 |
| 2004/0033664 A1 * | 2/2004 | Park | ............................... | 438/264 |
| 2005/0250283 A1 * | 11/2005 | Park | ............................... | 438/257 |

(Continued)

FOREIGN PATENT DOCUMENTS

CN    1992232 A    7/2007

*Primary Examiner* — Laura Menz
(74) *Attorney, Agent, or Firm* — Kilpatrick Townsend & Stockton LLP

(57) ABSTRACT

A method for manufacturing an Electrically Erasable Programmable Read-Only Memory (EEPROM) device includes providing a substrate and forming a gate oxide over the substrate. Also, the method includes providing a mask overlying the gate oxide layer, the mask defining a tunnel opening. The method additionally includes performing selective etching over the mask to form a tunnel oxide layer. The method includes forming a floating gate over the tunnel oxide layer and a selective gate over the gate oxide layer. The method includes angle doping a region of the substrate using the floating gate as a mask to obtain a first doped region. The method further includes forming a dielectric layer over the floating gate and a control gate over the dielectric layer. The method additionally includes angle doping a second region of the substrate using the selective gate as a mask to obtain a second doped region, wherein the first and second doped regions partially overlap.

12 Claims, 6 Drawing Sheets

U.S. PATENT DOCUMENTS

2006/0006452 A1* 1/2006 Park et al. .................... 257/314
2009/0242961 A1* 10/2009 Tang et al. ................... 257/324
2011/0133264 A1* 6/2011 Jan et al. ...................... 257/315
2011/0260235 A1* 10/2011 Orimoto et al. ............... 257/319
2012/0025289 A1* 2/2012 Liang et al. ................... 257/316
2012/0228691 A1* 9/2012 Dunga et al. ................. 257/315

* cited by examiner

SYSTEM AND METHOD FOR EEPROM ARCHITECTURE

CROSS-REFERENCES TO RELATED APPLICATIONS

This application claims priority to Chinese Patent Application No. 200910199991.X, filed Dec. 4, 2010, which is commonly owned and incorporated by reference herein for all purposes.

BACKGROUND OF THE INVENTION

Embodiments of the present invention generally relate to integrated circuits and the processing for the manufacture of semiconductor devices. More particularly, embodiments of the present invention relate to flash EEPROM cell architecture for providing small cell size to nonvolatile memory devices.

In the semiconductor industry, Electrically Erasable Programmable Read-Only Memory (EEPROM) is classified as a non-volatile memory device because it can retain the stored data without the need of a power supply. Flash memory cell is one of the rapidly developed EEPROM memory devices. Since the structure of EEPROM is more complex compared to that of DRAM, a large integration of EEPROM memory also becomes more difficult.

In an EEPROM, each memory cell often has two transistors: an MOS transistor for control and a floating gate transistor for storage. The storage part of an EEPROM cell resembles a permanently-open or closed MOSFET transistor having two gates: a floating gate and a control gate. When the "floating gate" is charged, it holds the charge and impedes the flow of electrons from the control gate to the silicon (the 0 or 1 is determined by whether the actions of the control gate are blocked or not). Charging is accomplished by grounding the source and drain terminals and placing a voltage on the control gate. Applying a reverse voltage via the MOSFET transistor causes the charge to dissipate into the substrate.

The conventional flash EEPROM cell has two states (for storing binary information) depending on whether a charge is present at the floating gate or not. This arrangement has a disadvantage that the chip size increases proportionally with the number of memory cells. Typically, non-volatile memory devices have two types of structure: a stack gate structure and a split gate structure.

A stack gate structure generally includes a control gate on top and a floating gate underneath the control gate. The stack gate structure generally faces an over-erased problem. If a memory cell in the memory array architecture is over-erased, an undesirable leaking current will occur during the read operation of the other memory cells. The process for manufacturing a stack-gate memory cell is generally simpler than that having a split-gate structure. However, a stack-gate cell has an over-erase problem which a split-gate cell does not have; because of that the split-gate structure of memory cell is more widely used.

The EEPROM memory device having the split gate structure includes a control gate, a floating gate and can have an additional gate known as a select gate, wherein the control gate is also disposed above the floating gate, but these two are laterally offset. Although the split-gate memory cell has no over erase problem, the formation of the additional gate, i.e. the select gate, requires more complex processing steps and consumes additional chip area. The split-gate memory cell is thus, generally larger than the stack-gate memory cell. The split-gate memory cell is difficult to scale down because the select gate and/or the control gate are not self-aligned to the floating gate.

Accordingly, it is seen that an improved cell architecture for split-gate EEPROM for providing smaller cell size is desired.

BRIEF SUMMARY OF THE INVENTION

Embodiments of the present invention generally relate to integrated circuit devices and the method for manufacturing semiconductor devices. More particularly, embodiments of the present invention relate to flash EEPROM cell architecture for providing small cell size to nonvolatile memory devices.

A specific embodiment of the invention provides a method for manufacturing an Electrically Erasable Programmable Read-Only Memory (EEPROM). The method includes providing a semiconductor substrate. The method also includes defining an active region in the semiconductor substrate. The method further includes forming a gate oxide layer over the semiconductor substrate. Also, the method includes providing a first mask pattern overlying the gate oxide layer to define a tunnel oxide opening. The method additionally includes performing selective etching over the first mask to form a tunnel oxide layer. The method also includes depositing a first polysilicon layer over the tunnel oxide layer and over the gate oxide layer. The method includes etching the first polysilicon layer to obtain a floating gate and a selective gate, the floating gate having a top and a first side and a second side. Moreover, the method includes angle doping with a first dopant at a first dose and a first energy level the floating gate to obtain a first doped region and a second doped region in the substrate, wherein the first and second doped regions may extend partially underneath the first and second sides of the floating gate. The method additionally includes forming a dielectric layer over the floating gate including the first and second sides. The method also includes depositing a second polysilicon structure over the dielectric layer. The method further includes angle doping a third portion of the semiconductor substrate with a second dopant at a second dose level and second energy level, the third doped portion partially overlaps the second doped portion.

In another embodiment, a method for manufacturing an Electrically Erasable Programmable Read-Only Memory device includes providing a substrate and forming a gate oxide over a first region of the substrate and forming a tunnel oxide over a second region of the substrate. The gate oxide and the tunnel oxide have a different thickness. The method also includes forming a floating gate over the tunnel oxide and forming a selective gate over the gate oxide. The method further includes angle doping the first region of the substrate using the floating gate as a mask for obtain a first doped region. The method includes forming a dielectric layer over the floating gate and forming a control gate over the dielectric layer. In an embodiment, the method further includes angle doping the second region of the substrate using the selective gate as a mask to obtain a second doped region, wherein the second doped region partially overlaps the first doped region.

In yet another embodiment, an Electrically Erasable Programmable Read-Only Memory (EEPROM) device includes a semiconductor substrate having an active region, a tunnel oxide over a first region of the semiconductor substrate, and a gate oxide over a second region of the semiconductor substrate, wherein the gate oxide has a thickness different from the thickness of the tunnel oxide. The EEPROM device also includes a floating gate over the tunnel oxide and a selective gate over the gate oxide. The EEPROM device additionally includes a dielectric layer over the floating gate and a control gate over the dielectric layer, wherein a first portion of the first region of the semiconductor substrate is angle doped with arsenic ions at a dose of about 10E13 ions/cam using the floating gate as a mask. The EEPROM device further includes a second portion of the second region that is angle doped with phosphorous ions at a dose of about 10E12 to about 10E14 ions/cm$^2$, wherein the second doped portion and the first doped portion are partially overlapping.

Embodiments of the present invention can provide many benefits over conventional techniques. Embodiments of the present invention offer significant unobvious advantages in the fabrication of nonvolatile memory devices. For example, the present technique provides a novel and useful way of manufacturing EEPROM cells that have smaller size compared to conventional devices. Depending upon the embodiment, one or more of these benefits may be achieved. These and other benefits will be described in more throughout the present specification and more particularly below. Various additional embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE EMBODIMENTS

Embodiments of the present invention generally relate to integrated circuit devices and their processing for the manufacture of semiconductor devices. More particularly, embodiments of the present invention relate to flash EEPROM cell architecture for providing small cell size for nonvolatile semiconductor devices. Merely by way of example, embodiments of the invention have been applied to the formation of the cell architecture for nonvolatile memory device, but it would be recognized that the invention has a much broader range of applicability.

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

Figure 1A:
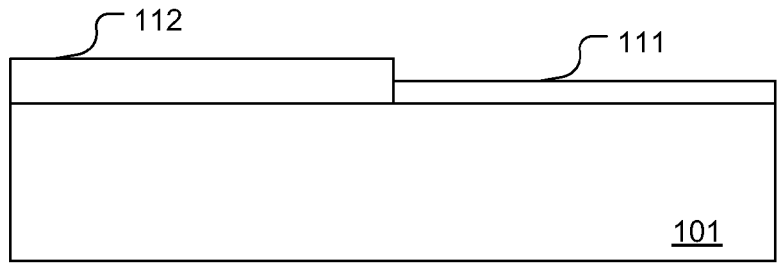
FIGS. 1A though 1D are cross-sectional views illustrating a conventional structure of split-gate EEPROM.
Figure 1B:
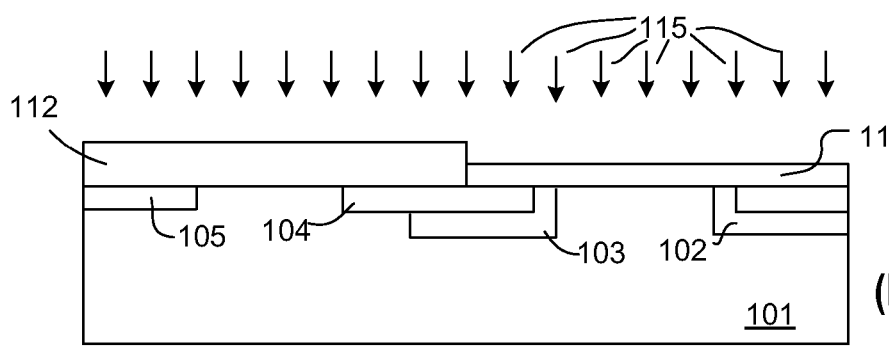
Figure 1C:
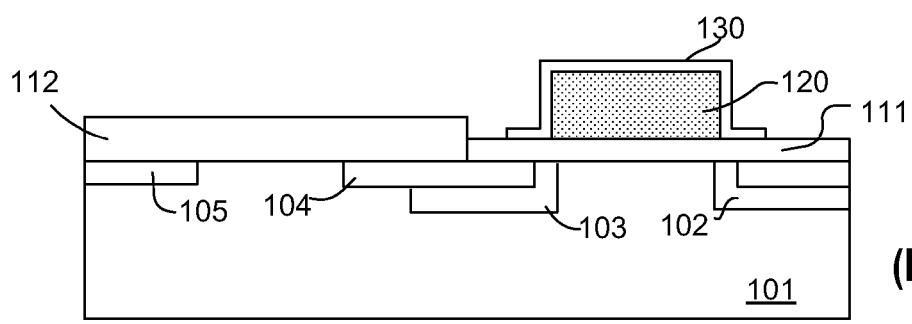
Figure 1D:
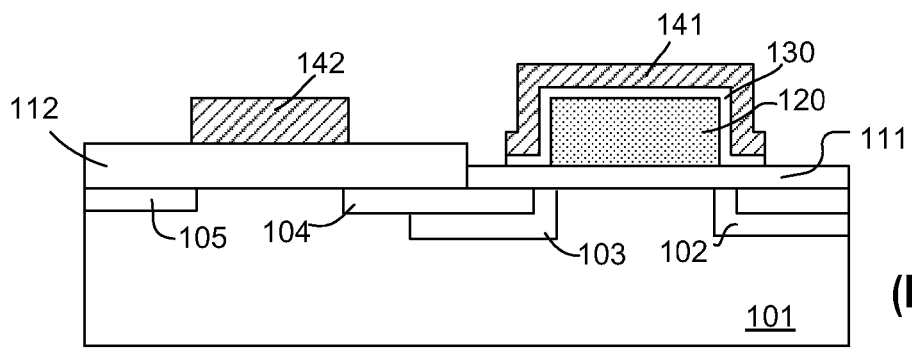

FIGS. 1A through 1D are cross-sectional views illustrating a conventional structure and method of manufacturing a split-gate EEPROM. Referring to FIG. 1A, a tunnel oxide layer 111 and a gate oxide layer 112 are formed on a substrate 101. Shown in FIG. 1B, an ion implantation 115 forms a first lightly doped source region 102 and a first lightly doped drain region 103 for a to-be-formed floating gate transistor. The ion implantation 115 also forms a second lightly doped source region 104 and a second lightly doped drain region 105 for a to-be-formed MOS transistor. Referring to FIG. 1C, a first polysilicon layer 120 is deposited over the tunnel oxide layer and the gate oxide layer. A photoresist mask overlies a region of the first polysilicon layer that overlaps the first lightly doped source and drain regions. A floating gate structure 120 is obtained after etching the first polysilicon layer and removing the photoresist layer. An insulation layer 130 is then deposited over the top and the sides of the floating gate. A second polysilicon layer is deposited over the gate oxide layer 112, the tunnel oxide layer 111, and the floating gate 120 including the insulation layer 130. The second polysilicon layer is then pattern edged leaving a first portion 141 overlying the insulation layer 130 and a second portion 142 overlying the gate oxide layer and overlapping a portion of the second source and drain regions, as shown in FIG. 1D. In the conventional method, the control gate 141 and the floating gate 120 overlap the first source and drain regions; the overlapping increases the size of the floating gate. Similarly, the selective gate 142 overlaps the second source and drain regions and increases thus the size of the selective gate. Embodiments of the present invention provide a novel method of manufacturing a split-gate EEPROM without having the disadvantages described above in the conventional art.

Figure 2:
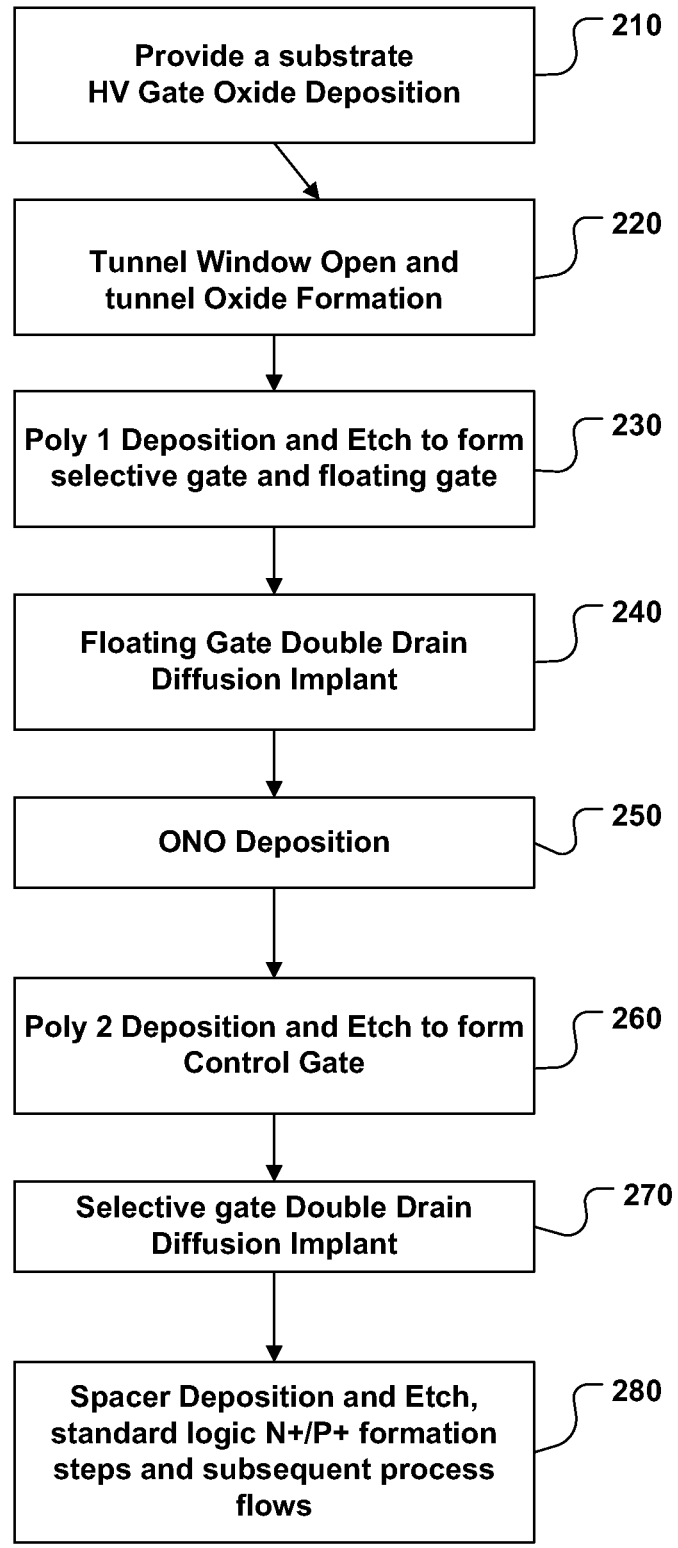
FIG. 2 is a simplified process flow illustrating exemplary sequential processes for forming the split-gate EEPROM cell according to an embodiment of the present invention.

FIG. 2 is a simplified process flow diagram illustrating a method of forming the split-gate EEPROM cell according to an embodiment of the present invention. In step 210, a semiconductor substrate is provided and a high voltage (HV) gate oxide is deposited on the semiconductor substrate in which an active region is defined. A photoresist pattern (not shown) is formed on the HV gate oxide by photolithography step using the tunnel window open mask and subsequently the exposed HV gate oxide film is etched. Then, a tunnel oxide layer is formed on the exposed surface of the semiconductor substrate in step 220.

In step 230, a first polysilicon film is deposited over the tunnel oxide layer and the HV gate oxide and subsequently patterned to form a selective gate and a floating gate. In step 240, a buried N-type layer is formed by floating gate double diffused drain implantation process according to an embodiment of the present invention. Arsenic (Ar) ions are ion-implanted as shown in step 240. Then, an ONO dielectric layer is formed over the tunnel oxide layer, the selective gate, and the floating gate in step 250. In an embodiment, the ONO dielectric layer can be made of silicon oxide, silicon nitride and silicon oxide having a thickness of 100 Angstrom each.

In step 260, a second polysilicon layer is formed over the ONO dielectric layer. In an embodiment, the second polysilicon (poly 2) layer can be polysilicon, amorphous silicon or recrystallized silicon. The poly 2 layer is patterned to form the control gate. The ONO layer is then removed except the portions that cover the top and the sides of the floating gate to insulate it from other electrodes. Then, a double diffused drain ion implantation is performed with phosphorous (P) ions to form a lightly-doped source and drain region on the silicone substrate as shown in step 270. Subsequent process steps including spacer deposition and etch, and the formation of N+/P+ doped regions are all well known to those in the industry.

Figure 3A:
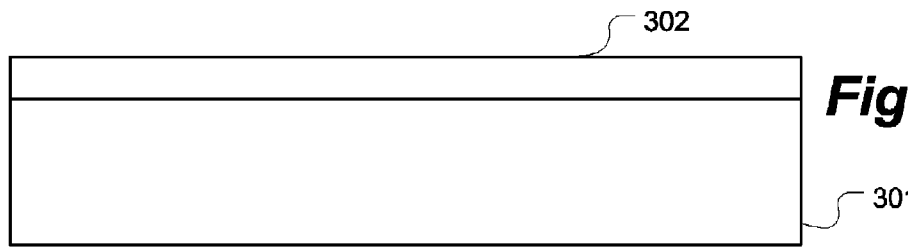
FIG. 3A through 3G are cross-sectional views illustrating a structure of split-gate EEPROM cell and method of manufacturing the same according to an embodiment of the present invention.

FIGS. 3A through 3G are cross-sectional views illustrating the structure of a split-gate EEPROM cell and method of manufacturing the same according to an embodiment of the present invention. Referring now to FIG. 3A, a high voltage (HV) gate oxide layer 302 is formed on a semiconductor substrate 301 in which an active region is defined. In the above, HV gate oxide film 302 is formed having a thickness of about 150 Angstroms to about 370 Angstroms.

Figure 3B:
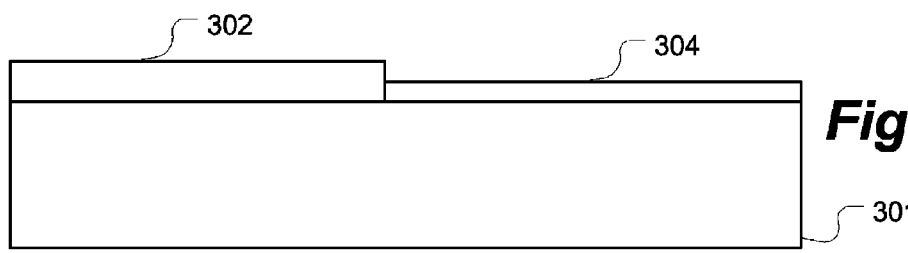

FIG. 3B illustrates a tunnel window open masking and tunnel oxide formation process (step 220). A photoresist pattern (not shown) is formed on the HV gate oxide 302 by exposure and developing process using the tunnel window open mask. Exposed HV gate oxide film is selectively etched by a subsequent etching process to form a tunnel oxide film 304. In an embodiment, tunnel oxide film 304 is formed having a thickness ranging from about 40 Angstroms to about 160 Angstroms.

Figure 3C:
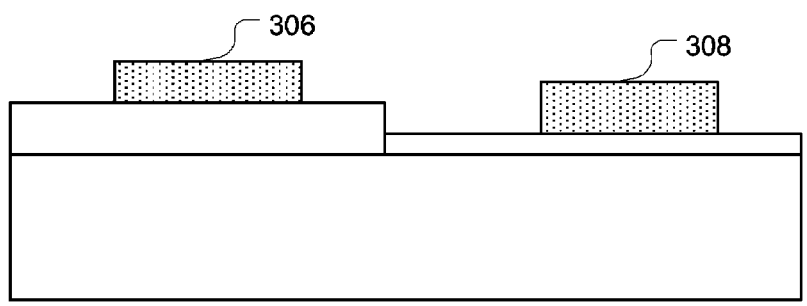

Referring to FIG. 3C, poly 1 deposition and poly 1 patterning steps are shown (step 230). In an embodiment, poly 1 film is formed having a thickness of about 1000 Angstroms to about 3000 Angstroms and subsequently patterned using photolithography and etching process to form a selective gate 306 and a floating gate 308.

Figure 3D:
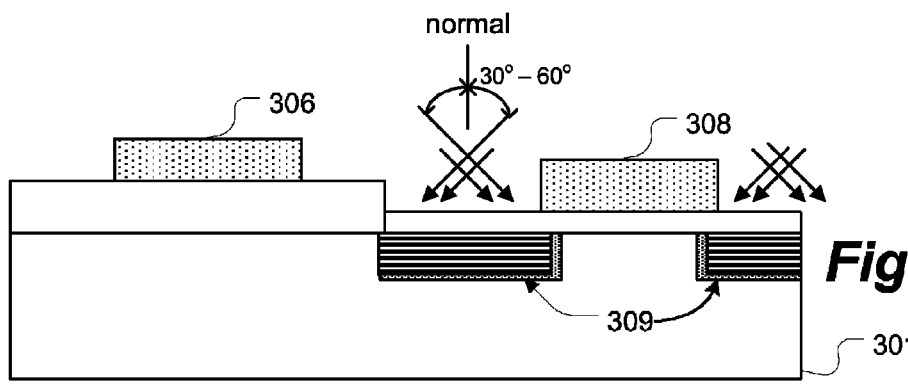

Referring to FIG. 3D, a buried N-type layer 309 is formed using a floating gate double diffused drain implantation process according to an embodiment of the present invention. In an exemplary embodiment, Arsenic (Ar) ions are implanted at a dose of about 10E13 ions/cm$^2$ with an energy of 40 KeV and under an implantation angle of 30° to 60° to a normal as shown in FIG. 3D to form the buried N-type layer 309. By using this implantation technique, the transistor size can be reduced in comparison to conventional techniques.

Figure 3E:
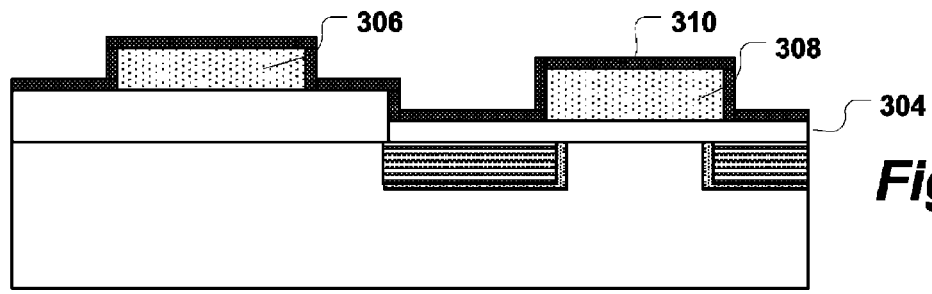

Referring to FIG. 3E, an ONO dielectric layer 310 is formed overlying the tunnel oxide layer 304, the selective gate 306, and the floating gate 308 (step 250). In an embodiment, the ONO dielectric layer 310 can be made of silicon oxide, silicon nitride and silicon oxide having a thickness of about 100 Angstroms each. ONO dielectric layer 310 is used to insulate the floating gate 308 from other electrodes.

Figure 3F:
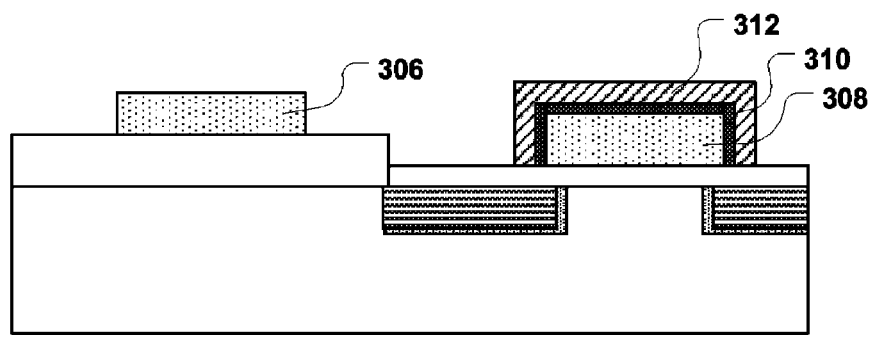
Figure 3G:
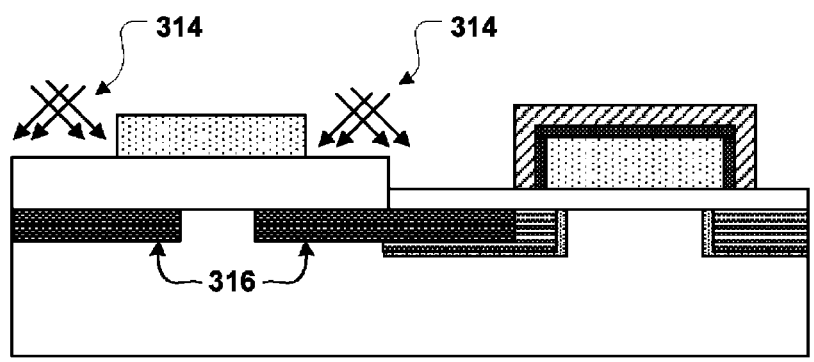

Referring to FIG. 3F, a second poly silicon layer (poly 2) is deposited overlying the ONO layer. The second polysilicon layer is then patterned and etched. As a result, a poly 2 layer 312 is formed as a control gate covering the top and the sides of the ONO dielectric layer 310 of the floating gate 308 as shown in FIG. 3E (step 260). The poly 2 layer 312 can be polysilicon, amorphous silicon or recrystallized silicon. In an embodiment, the poly 2 layer may have a thickness of about 1000 Angstroms through 3000 Angstroms. Then, a double diffused drain ion implantation 314 is performed with phosphorous (P) ions having the dose of about 10E12 to about 10E14 ions/cm$^2$ with an energy of 60-80 KeV and an implantation angle of about 30° to 60° to a normal (i.e., a vertical line referenced to the surface of the HV gate oxide layer 302) to form a lightly-doped source and drain regions 316 on the silicone substrate as shown in FIG. 3G (step 270).

Figure 4A:
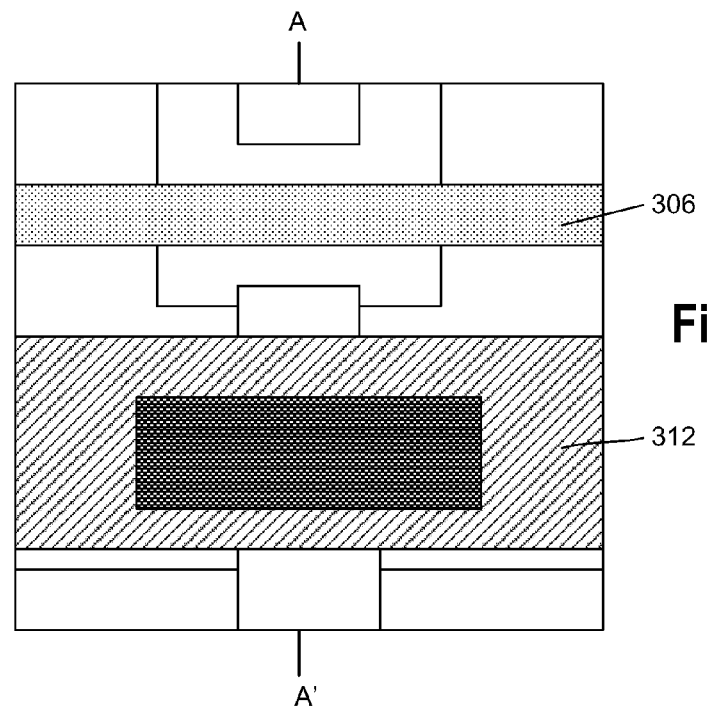
FIGS. 4A and 4B are top and simple cross-sectional views illustrating the structure of split-gate EEPROM according to an embodiment of the present invention after source/drain region formation step is finished.
Figure 4B:
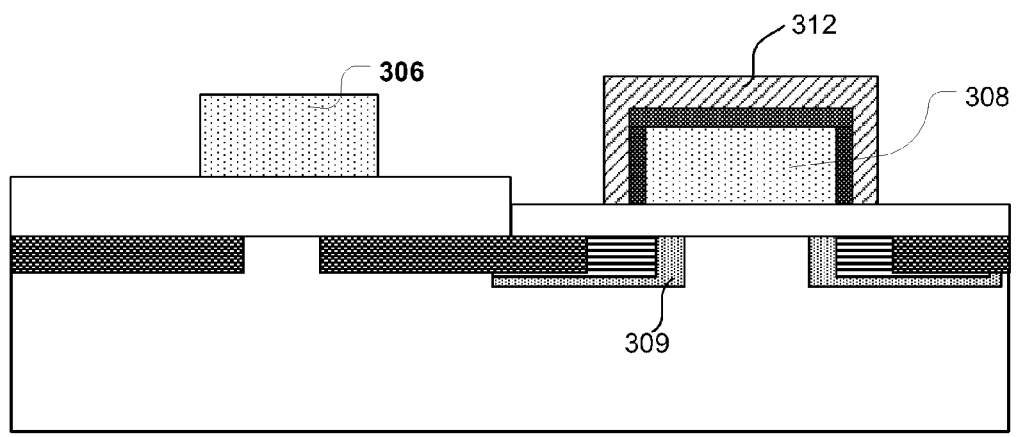

FIGS. 4A and 4B are top and cross-sectional views illustrating the structure of a split-gate EEPROM according to an embodiment of the present invention. FIG. 4B is a cross-sectional view taken along the line A-A' of FIG. 4A illustrating the structure of a split-gate EEPROM cell. According to an embodiment of the present invention, floating gate 308 is formed by poly 1 layer, and control gate 312 is formed by poly 2 layer, while the selective gate 306 is formed by the poly 1 layer. According to another embodiment of the present invention, impurity region 309 constitutes a source or drain impurity region formed by "floating gate double diffusion implant" method.

Figure 5:
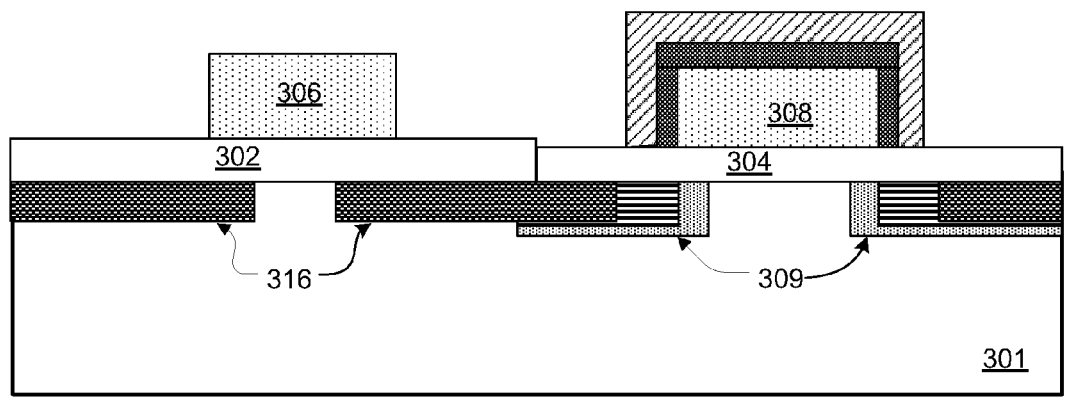
FIG. 5 is a cross-sectional view illustrating a structure of split-gate EEPROM according to an embodiment of the present invention.

FIG. 5 is a simple cross-sectional view illustrating the structure of split-gate EEPROM according to an embodiment of the present invention after source/drain forming step is done. As explained above with reference to FIG. 3D, in the flash EEPROM cell of the present invention formed by the above process, a buried N-type layer 309 is formed by floating gate double drain diffusion implantation. As an example, the size of the flash EEPROM manufactured according to the present invention can be smaller than conventional flash EEPROM.

The present invention has been described with reference to a particular embodiment in connection with a particular application. Those having ordinary skill in the art and access to the teachings of the present invention will recognize additional modifications and applications within the scope thereof. It is therefore intended to cover any and all such applications, modifications, and embodiments within the scope of the present invention.

What is claimed is:

1. A method of manufacturing an Electrically Erasable Programmable Read-Only Memory (EEPROM), the method comprising:

providing a semiconductor substrate having an active region;

forming a gate oxide layer overlying the semiconductor substrate;

providing a first mask overlaying the gate oxide layer, the first mask defining a tunnel gate opening;

selectively etching the gate oxide layer using the first mask to form a tunnel oxide layer;

depositing a first polysilicon layer overlying the gate oxide layer and the tunnel oxide layer;

etching the first polysilicon layer to obtain a floating gate structure and a selective gate structure, the floating gate structure having a top and a first side and a second side, and the selective gate structure having a third side and a fourth side;

angle doping the floating gate structure with a first dopant at a first dose and a first energy level to obtain a first doped region and a second doped region;

forming a dielectric layer structure overlying the gate oxide layer, the tunnel oxide layer, the selective gate structure, and the top and the first and second sides of the floating gate structure;

removing the dielectric layer except a portion covering the top and the first and second sides of the floating gate structure;

depositing a second polysilicon layer overlying the portion of the dielectric layer structure covering the top and the first and second sides of the floating gate structure to form a control gate structure; and angle doping the selective gate of the selective gate with a second dopant at a second dose and a second energy level to obtain a third doped region;

wherein the first doped and second doped partially extend underneath the first and the second sides of the floating gates, wherein the third doped region partially overlaps the second doped region.

2. The method of claim 1, wherein the gate oxide layer comprises a thickness ranging from about 150 Angstroms to about 370 Angstroms.

3. The method of claim 1, wherein the tunnel oxide layer comprises a thickness ranging from about 40 Angstroms to about 160 Angstroms.

4. The method of claim 1, wherein the control gate structure comprises a thickness ranging from about 1000 Angstroms to about 3000 Angstroms.

5. The method of claim 1, wherein the dielectric layer structure comprises a thickness of about 300 Angstroms.

6. The method of claim 1, wherein the dielectric layer structure comprises an oxide-nitride-oxide layer.

7. The method of claim 6, wherein the oxide-nitride-oxide layer comprises a silicon nitride layer interposed between silicon oxide layers, the silicon nitride layer having a thickness of about 100 Angstroms.

8. The method of claim 1, wherein the angle doping comprises an impurity comprising a material selected from the group consisting of phosphorous and arsenic and under an angle ranging between 30° to 60°.

9. The method of claim 1, wherein the first energy level is approximately 40 KeV.

10. The method of claim 1, wherein the first concentration level is about 10E13 ions/cm$^2$.

11. The method of claim 1, wherein the first dopant comprises arsenic ions.

12. The method of claim 1, wherein the gate oxide layer comprises high-voltage gate oxide material.

\* \* \* \* \*